US007598022B2

(12) United States Patent  
Su et al.

(10) Patent No.: US 7,598,022 B2  
(45) Date of Patent: Oct. 6, 2009

(54) POSITIVE AND NEGATIVE DUAL FUNCTION MAGNETIC RESIST LITHOGRAPHY

(75) Inventors: Wei-Fang Su, Taipei (TW); Yang-Fang Chen, Taipei (TW); Ming-Chung Wu, Taipei (TW); Chih-Min Chuang, Taipei (TW); Yu-Ching Huang, Taipei (TW)

(73) Assignee: National Taiwan University, Taipei (TW)

( * ) Notice: Subject to any disclaimer, the term of this patent is extended or adjusted under 35 U.S.C. 154(b) by 696 days.

(21) Appl. No.: 11/459,201

(22) Filed: Jul. 21, 2006

(65) Prior Publication Data

US 2008/0020325 A1    Jan. 24, 2008

(51) Int. Cl.  
G03C 5/00 (2006.01)  
G03F 7/00 (2006.01)

(52) U.S. Cl. ............... 430/311; 430/322; 430/296; 430/330; 430/270.1

(58) Field of Classification Search .......... 430/322, 430/311, 296, 330, 270.1  
See application file for complete search history.

(56) References Cited

U.S. PATENT DOCUMENTS

| | | | | |
|---|---|---|---|---|
| 5,776,660 A | * | 7/1998 | Hakey et al. | 430/296 |
| 6,114,082 A | * | 9/2000 | Hakey et al. | 430/270.1 |
| 6,147,394 A | * | 11/2000 | Bruce et al. | 257/506 |
| 6,190,829 B1 | * | 2/2001 | Holmes et al. | 430/270.1 |
| 6,284,439 B1 | * | 9/2001 | Holmes et al. | 430/325 |
| 6,338,934 B1 | * | 1/2002 | Chen et al. | 430/270.1 |
| 6,440,635 B1 | * | 8/2002 | Holmes et al. | 430/270.1 |

FOREIGN PATENT DOCUMENTS

TW        574608    *  2/2004

OTHER PUBLICATIONS

Chen et al., "Mechanism and Modeling of Ring Pattern Formation for Electron Beam Exposure on Zwitterresist" Jp. J. Appl. Phys. vol. 42 (2003) pp. 3838-3841, Part I, No. 6B, Jun. 2003.*

* cited by examiner

Primary Examiner—Mark F Huff  
Assistant Examiner—Caleen O Sullivan  
(74) Attorney, Agent, or Firm—WPAT., P.C.; Justin King

(57) ABSTRACT

The present invention discloses a positive and negative dual function magnetic resist lithography method. At first, a substrate coated with a positive and negative dual function magnetic resist layer is provided. The positive and negative dual function magnetic resist layer comprises a manganese(Mn)-containing precursor and at least one hydrophilic polymer. Next, at least one exposure procedure for the positive and negative dual function magnetic resist layer is performed to form either a positive resist or a negative resist. In addition, after the at least one exposure procedure, a developing procedure using water-soluble developer is performed.

43 Claims, 7 Drawing Sheets

POSITIVE AND NEGATIVE DUAL FUNCTION MAGNETIC RESIST LITHOGRAPHY

BACKGROUND OF THE INVENTION

1. Field of the Invention

The present invention is generally related to a lithography method, and more particularly to a positive and negative dual function magnetic resist lithography method.

2. Description of the Prior Art

Perovskite-type oxides ($ABO_3$) become an important research focus for multifunctional materials in recent years due to its various special properties, such as paraelectric, piezoelectric, and photoelectric properties.

According the report in *Materials Chemistry and Physics*, 77, 639-646, (2002), perovskite-type oxides can be prepared by ball-milling $La_2O_3$, $MnCO_3$, and $SrCO_3$ raw materials for 24 hrs and then sintering at 1000° C. for 2 hrs and maintaining at 1250° C. for 5 hrs.

According to another report in *J. Mater. Res.*, Vol. 15[5], 1161-1166 (2000), solid-state reactions is also used to prepare perovskite-type oxides. Lanthanum strontium manganese oxides and carbonates, such as $La_2O_3$, $MnCO_3$, and $SrCO_3$ with proper molar ratio, are sintered at 1200° C. for 12 hrs, ball-milled, cold isostatically pressed, and then sintered at 1450° C. for 48 hrs. Although the process is simpler, the longer duration at high temperature is required. Besides, particle diameters are in the micron range ($10^{-6}$ m). It is difficult to control compositions and uniformity.

The disadvantages of using solid-state reactions to prepare perovskite-type oxides are difficulty in the mixing process and in the composition control, and the requirement of sintering at high temperature. Therefore, liquid-phase methods, such as sol-gel method, are utilized, instead.

In the liquid-phase methods, metallic salts are used as starting raw materials, such as acetates (*J. Am. Ceram. Soc.*, 75[4], 964-970 (1992)) and nitrates (*J. Am. Ceram. Soc.*, 75[1], 201-202 (1992)). Phase promoters are poly(acrylic acid) (*J. Am. Ceram. Soc.*, 75[1], 201-202 (1992)), poly(vinyl alcohol) (*J. Am. Ceram. Soc.*, 80[10], 2702-2704 (1997)), citric acid (*J. Mater. Res.*, 9[4], 986-991 (1994)), and so forth.

Using liquid-phase methods to synthesize perovskite crystal phase oxides, the lanthanum strontium manganese oxides usually can be formed at the temperature below 500° C. For example, in the nitrate-poly(acrylic acid) system, the crystal phase with perovskite structure can be fabricated by using poly(acrylic acid) to make the precursor solution become gelation and then sintering at 400° C. for 6 hrs.

In the nitrate-acetate-citric acid system reported in *J. Mater. Res.*, 9[4], 986-991 (1994), thermally induced anion oxidation-reduction (auto ignition) reaction is utilized to form the crystal phase of the lanthanum strontium manganese oxides. The particle diameter obtained by this method is larger than that in the nitrate-poly(acrylic acid) system.

According to the report in *J. Am. Ceram. Soc.*, 80[10], 2709-2713 (1997), the lanthanum strontium manganese acrylates are used as the precursor solution to be spin-coated on silicon wafers and fused quartz substrates. The perovskite crystal phase is formed by multiple coatings to increase film-thickness and then calcination at 850° C.

According to the report in *J. Am. Ceram. Soc.*, 80[10], 2702-2704 (1997), the lanthanum strontium manganese oxalates are used as starting materials and PVA (poly(vinyl alcohol)) is then added so as to form the precursor solution. The precursor solution is spin-coated on the fused quartz substrate and then sintered at 550° C. to thereby form the perovskite crystal phase. Compared to the conventional solid-state synthetic method, the liquid-phase method for preparing the perovskite crystal phase takes lower sintering temperature.

The Taiwan patent No. 574608 discloses a zwitterresist lithography for positive resist and negative resist processes by varying the exposure doses of electron beams to prepare positive and negative resists in the same resist layer. When the exposure dose is low, polymeric bonding is broken in the resist layer to be removable during the developing process and thereby to show the characteristic of positive resists. On the other hand, when the exposure dose is increased to a threshold value, the increased energy causes the separated polymeric molecules to form polymeric blocks to have crosslinking reactions and thereby to show the characteristic of negative resists. However, magnetic resist material is not provided by neither this Taiwan patent nor the commercial resist materials as well as the requirement of developing with water-soluble solvents. In light of the above problems, it is an important research topic in the development of a new magnetic resist with both positive and negative resist properties, water-soluble solvent developable property, and capability of preparing nano-scale patterns.

SUMMARY OF THE INVENTION

In accordance with the present invention, a positive and negative dual function magnetic resist lithography method is provided. This positive and negative dual function magnetic resist lithography method can meet the requirement of the industry.

One object of the present invention is to provide a positive and negative dual function magnetic resist for forming positive and negative resists with nano-scale patterns by varying exposure doses. Furthermore, the process according to the present invention uses water-soluble solvent as the developing solvent in accordance with environmental protection trend. Clean production and green supply chain are introduced to the production of magnetic device integrated circuit, integrated circuit design industry, wafer foundry industry, and printed circuit industry.

Another object of the present invention is to provide the formed pattern with magnetic property. Because the magnetic device is formed directly, the pattern process time is significantly reduced as well as the production cost. Thus, the present invention corresponds to both economic effect and utilization in industry.

Accordingly, the present invention discloses a positive and negative dual function magnetic resist lithography method. At first, a substrate coated with a positive and negative dual function magnetic resist layer is provided. The positive and negative dual function magnetic resist layer comprises a manganese(Mn)-containing precursor and at least one hydrophilic polymer. Next, at least one exposure procedure for the positive and negative dual function magnetic resist layer is performed to form either a positive resist or a negative resist. In addition, after the at least one exposure procedure, a developing procedure using water-soluble developer is performed.

DESCRIPTION OF THE PREFERRED EXAMPLES

Figure 1:
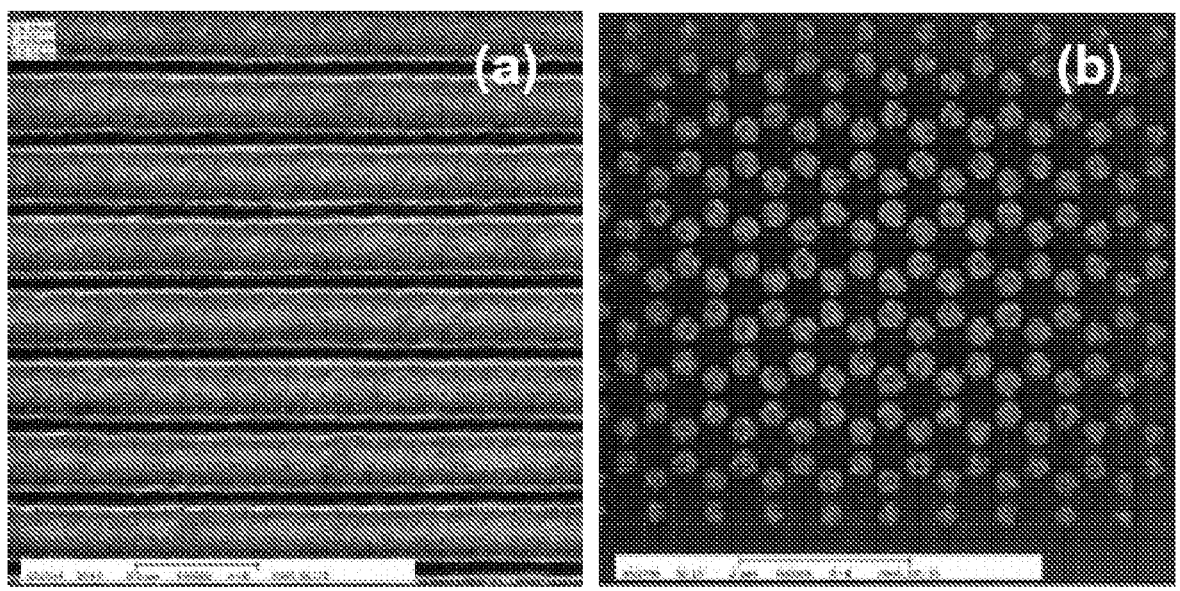
FIG. 1 shows the scanning electron microscopic (SEM) photographs of the finished products by the positive and negative dual function magnetic resist lithography method in which (a) is the SEM photograph of the negative resist and (b) is the SEM photograph of the positive resist.

What is probed into the invention is a positive and negative dual function magnetic resist lithography method. Detail descriptions of the structure and elements will be provided in the following in order to make the invention thoroughly understood. Obviously, the application of the invention is not confined to specific details familiar to those who are skilled in the art. On the other hand, the common structures and elements that are known to everyone are not described in details to avoid unnecessary limits of the invention. Some preferred examples of the present invention will now be described in greater detail in the following. However, it should be recognized that the present invention can be practiced in a wide range of other embodiments besides those explicitly described, that is, this invention can also be applied extensively to other embodiments, and the scope of the present invention is expressly not limited except as specified in the accompanying claims.

In the first embodiment of the present invention, a positive and negative dual function magnetic resist lithography method is provided. At first, a substrate coated with a positive and negative dual function magnetic resist layer is provided. The positive and negative dual function magnetic resist layer comprises a manganese(Mn)-containing precursor and at least one hydrophilic polymer. The precursor comprises one selected from the group consisting of the following: nitrate, hydroxide, oxalate, metallic alcoholate, acetate, citrate, and acetylacetone complex. The hydrophilic polymer comprises one selected from the group consisting of the following: poly(acrylic acid) and poly(vinyl alcohol). Next, at least one exposure procedure for the positive and negative dual function magnetic resist layer is performed to form either a positive resist or a negative resist. In addition, after the at least one exposure procedure, a developing procedure using water-soluble developer, such as pure water, is performed.

In this embodiment, when the exposure energy is low, the polymeric compositions in the resist receive the low energy to be degraded, so as to show the characteristic of positive resist. On the other hand, when the exposure energy is high, the manganese precursor or other precursor has the auto ignition behavior to cause the volume of the resist to significantly inflate, so as to show the characteristic of negative resist. Furthermore, it is well known that energy can be accumulated. Therefore, when the same area is applied with two or more exposures of low energy, it shows similar result comparing with being applied with one exposure of high energy. However, when an area is applied with one exposure of high energy, the result can not be changed by applying another exposure of low energy, for chemical reaction is occurred under high exposure energy and it is an irreversible reaction. Additionally, by giving different exposure energy on different area of the same layer, the positive and negative dual function magnetic resist layer can form positive patterns and negative patterns in the same layer.

In this embodiment, the molar ratio of the manganese to the at least one hydrophilic polymer is about from 0.05 to 20 in the positive and negative dual function magnetic resist layer. The preferred range is about from 0.5 to 5. The above-mentioned hydrophilic polymer is used as phase promoter, so as to promote the precursors to form the perovskite crystal phase. In addition, organic acid (i.e. citric acid) has the function of phase promoting. Therefore, an organic acid can be optionally added to the positive and negative dual function magnetic resist layer. In a preferred example of the first embodiment, the positive and negative dual function magnetic resist layer further comprises a water-soluble solvent including one selected from the group consisting of the following: pure water, alcohol, and ketone. Moreover, part of the precursor and/or part of the at least one hydrophilic polymer are suspended particulates in the positive and negative dual function magnetic resist layer. The particle diameter of the suspended particulate is smaller than or equal to 100 μm.

In this embodiment, the exposure procedure uses electron beams or other high energy beams with different wavelengths, such as $CO_2$ laser. In the case of using electron beams, when the exposure dose is within a first range, the positive and negative dual function magnetic resist layer forms a positive resist. On the other hand, when the exposure dose is within a second range, the positive and negative dual function magnetic resist layer forms a negative resist. The exposure dose in the second range is greater than that in the first range. The first range is about from 0.5 $mC/cm^2$ to 5 $mC/cm^2$. The second range is about from 5 $mC/cm^2$ to 40 $mC/cm^2$. Furthermore, the exposure procedure further comprises a heating procedure. When the positive and negative dual function magnetic resist layer is heated within a first temperature range, a positive resist is formed. When the positive and negative dual function magnetic resist layer is heated within a second temperature range, a negative resist is formed. Besides, the temperature in the second temperature range is greater than that in the first temperature range. The first temperature range is about from 50° C. to 180° C. The second temperature range is about from 180° C. to 400° C.

In the second embodiment of the present invention, a positive and negative dual function magnetic resist lithography method is provided. At first, a substrate coated with a positive and negative dual function magnetic resist layer is provided. The positive and negative dual function magnetic resist layer comprises at least one hydrophilic polymer, a manganese (Mn)-containing first precursor, and at least one second precursor. The at least one second precursor each comprises one metallic element selected from the group consisting of the following: La, Sr, Ca, Ba, and Pb. The molar ratio of the manganese in the first precursor to total of the metallic elements in the at least one second precursor is 1:1. Next, at least one exposure procedure for the positive and negative dual function magnetic resist layer is performed to form either a positive resist or a negative resist. In addition, after the at least one exposure procedure, a developing procedure using water-soluble developer, such as pure water, is performed.

In this embodiment, the molar ratio of the metallic elements to the at least one hydrophilic polymer is about from 0.05 to 20 in the positive and negative dual function magnetic resist layer. The preferred range is about from 0.5 to 5. The selections of the precursors, the hydrophilic polymer, and the exposure procedure are in the same manner as the first embodiment. Furthermore, the positive and negative dual function magnetic resist layer can optionally comprise an organic acid (i.e. citric acid) as phase promoter. In a preferred example of this embodiment, the positive and negative dual function magnetic resist layer further comprises a water-soluble solvent including one selected from the group consisting of the following: pure water, alcohol, and ketone. Moreover, part of the precursor and/or part of the at least one hydrophilic polymer are suspended particulates in the positive and negative dual function magnetic resist layer. The particle diameter of the suspended particulate is smaller than or equal to 100 μm.

In the third embodiment of the present invention, a positive and negative dual function magnetic resist lithography method is provided. At first, a substrate coated with a positive and negative dual function magnetic resist layer is provided. The positive and negative dual function magnetic resist layer comprises at least one hydrophilic polymer, a lanthanum precursor, a strontium precursor, and a manganese precursor. The molar ratio of the sum of the lanthanum and the strontium to the manganese is 1:1. The preferred molar ratio of the lanthanum to the strontium is 7:3. Next, at least one exposure procedure for the positive and negative dual function magnetic resist layer is performed to form either a positive resist or a negative resist. In addition, after the at least one exposure procedure, a developing procedure using water-soluble developer, such as pure water, is performed.

In this embodiment, the molar ratio of the metallic elements to the at least one hydrophilic polymer is about from 0.05 to 20 in the positive and negative dual function magnetic resist layer. The preferred range is about from 0.5 to 5. The selections of the precursors, the hydrophilic polymer, and the exposure procedure are in the same manner as the first embodiment. Furthermore, the positive and negative dual function magnetic resist layer can optionally comprise an organic acid (i.e. citric acid) as phase promoter. In a preferred example of this embodiment, the positive and negative dual function magnetic resist layer further comprises a water-soluble solvent including one selected from the group consisting of the following: pure water, alcohol, and ketone. Moreover, part of the precursor and/or part of the at least one hydrophilic polymer are suspended particulates in the positive and negative dual function magnetic resist layer. The particle diameter of the suspended particulate is smaller than or equal to 100 μm.

Example 1

FIG. 1 shows the scanning electron microscopic (SEM) photographs of the finished products by the positive and negative dual function magnetic resist lithography method. FIG. 1(a) is the SEM photograph of the negative resist. The designed pattern is of straight lines with a width of 240 nm and an interval (distance between lines) of 60 nm. FIG. 1(b) is the SEM photograph of the positive resist. The designed pattern is a large area periodic pattern with honeycomb style. The light-colored circle in the center is about 400 nm. It is clear that periodic patterns with hundreds or even dozens of nanometers can be prepared by the positive and negative dual function magnetic resist according to the present invention.

Example 2

Figure 2:
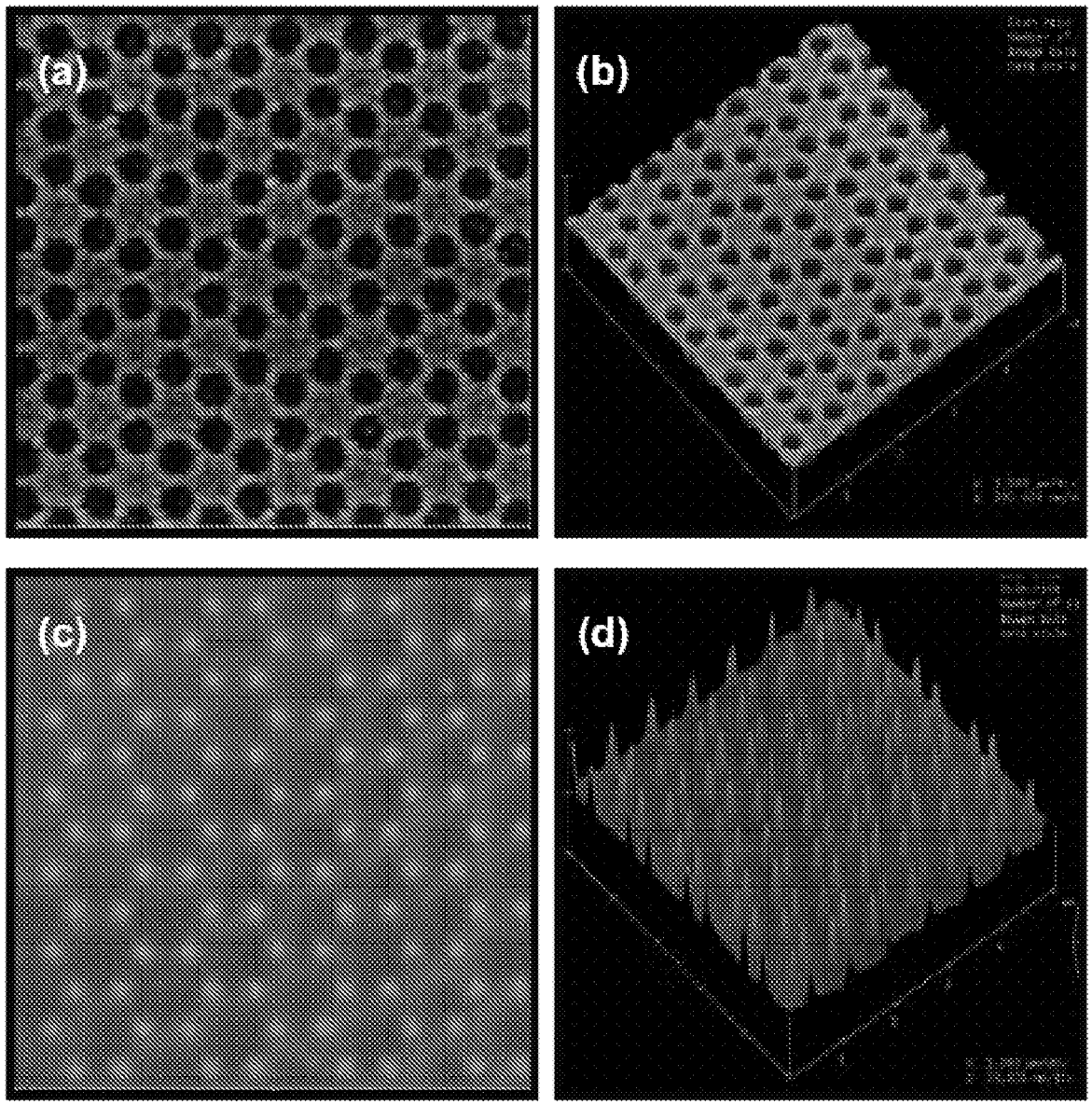
FIG. 2 shows the atomic force microscopic (AFM) photographs of the finished products with the size of 5 μm×5 μm by the positive and negative dual function magnetic resist lithography method in which (a) is the two-dimensional AFM photograph of the positive resist; (b) is the three-dimensional AFM photograph of the positive resist; (c) is the two-dimensional AFM photograph of the negative resist; and, (d) is the three-dimensional AFM photograph of the negative resist.

FIG. 2 shows the atomic force microscopic (AFM) photographs of the finished products with the size of 5 μm×5 μm by the positive and negative dual function magnetic resist lithography method. (a) and (b) in FIG. 2 are the two-dimensional and three-dimensional AFM photographs of the positive resist, respectively. (c) and (d) in FIG. 2 are the two-dimensional and three-dimensional AFM photographs of the negative resist, respectively. The positive and negative dual function magnetic resist according to the present invention forms both positive and negative resist patterns.

Example 3

Figure 3:
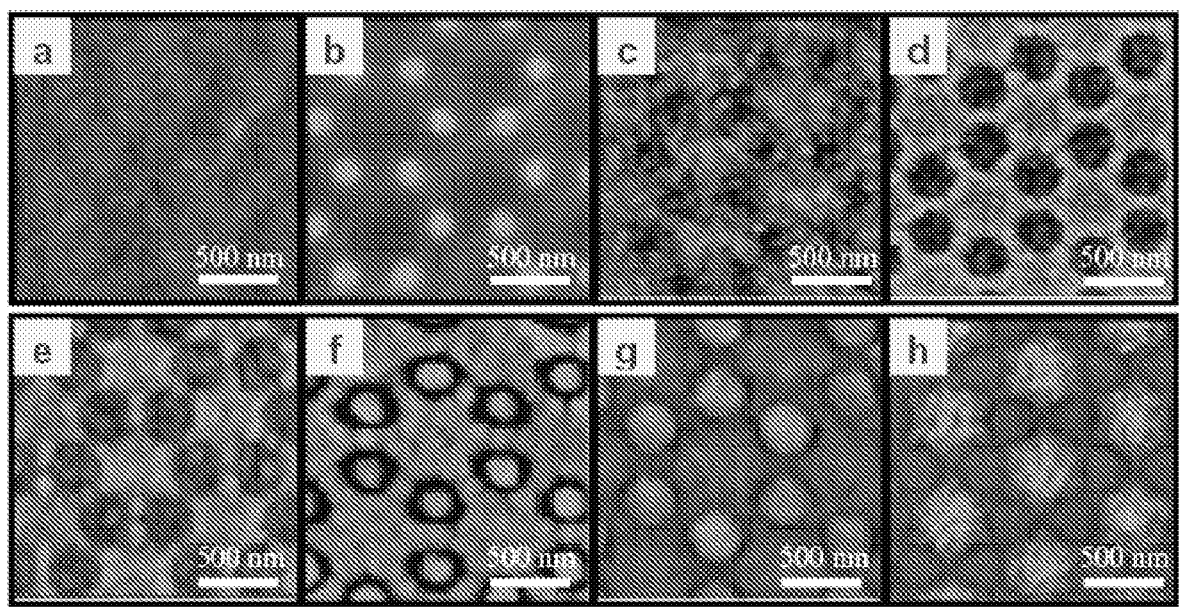
FIG. 3 shows the atomic force microscopic (AFM) photographs of the positive and negative dual function magnetic resist with the size of 5 μm×5 μm after exposed with different exposure doses and then developed in which (a) has the exposure dose of 0 $mC/cm^2$; (b) has the exposure dose of 0.1 $mC/cm^2$; (c) has the exposure dose of 0.6 $mC/cm^2$; (d) has the exposure dose of 2.0 $mC/cm^2$; (e) has the exposure dose of 2.5 $mC/cm^2$; (f) has the exposure dose of 4.2 $mC/cm^2$; (g) has the exposure dose of 7.3 $mC/cm^2$; (h) has the exposure dose of 50.0 $mC/cm^2$.

FIG. 3 shows the atomic force microscopic (AFM) photographs of the positive and negative dual function magnetic resist with the size of 5 μm×5 μg m after exposed with different exposure doses and then developed. In FIG. 3, (a)~(h) represent the cases exposed with different exposure doses: (a) has the exposure dose of 0 mC/cm$^2$; (b) has the exposure dose of 0.1 mC/cm$^2$; (c) has the exposure dose of 0.6 mC/cm$^2$; (d) has the exposure dose of 2.0 mC/cm$^2$; (e) has the exposure dose of 2.5 mC/cm$^2$; (f) has the exposure dose of 4.2 mC/cm$^2$; (g) has the exposure dose of 7.3 mC/cm$^2$; (h) has the exposure dose of 50.0 mC/cm$^2$. The results show that the positive resist pattern becomes the negative resist pattern as the exposure dose for the positive and negative dual function magnetic resist according to the present invention is increased.

Example 4

Figure 4:
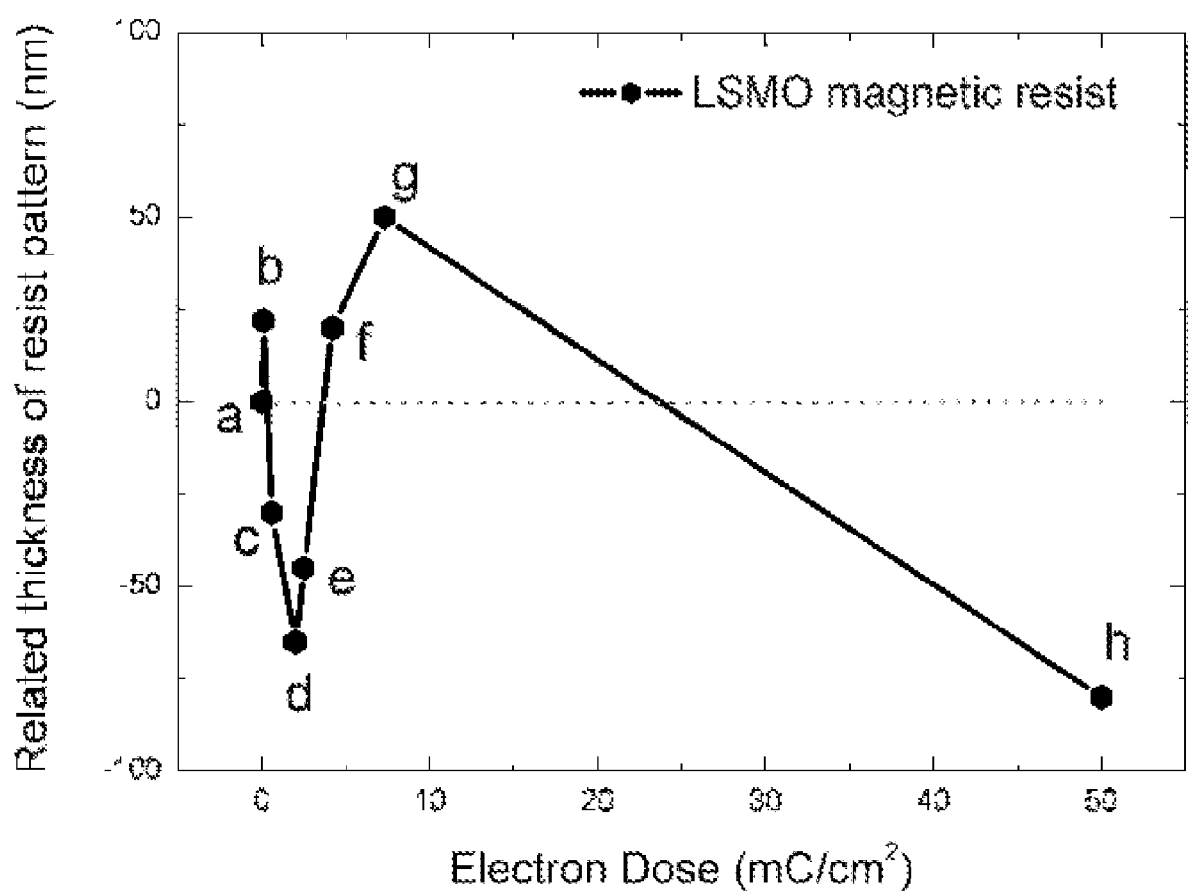
FIG. 4 shows the relative resist heights in the exposed area and the unexposed area measured by AFM after the positive and negative dual function magnetic resist thin film is processed by the exposure of electron beams with different exposure doses.

The positive and negative dual function magnetic resist according to the present invention is coated on a substrate to form a thin film with a thickness of 200 nm. The thin film is exposed by electron beams with different exposure doses. The relative resist heights in the exposed area and the unexposed area measured by AFM are shown in FIG. 4. When the electron exposure dose is within 0.2~4.0 mC/cm$^2$, the polymeric compositions in the resist receives the energy of low energy electron beams to be degraded, so as to show the characteristic of positive resist. On the other hand, when the electron exposure dose is increased to be within 5.0~30 mC/cm$^2$, the manganese precursor or other precursor has the auto ignition behavior to cause the volume of the resist to significantly inflate, so as to show the characteristic of negative resist.

Example 5

Figure 5:
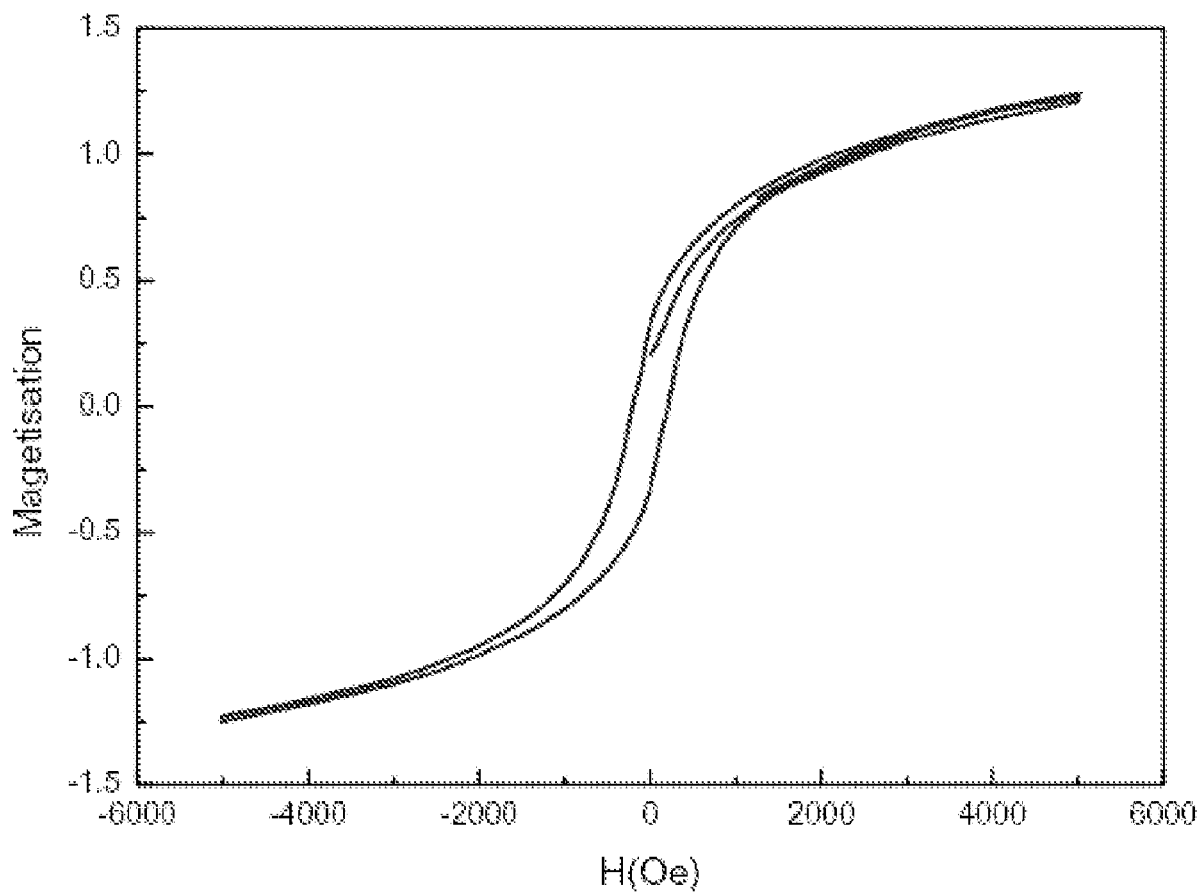
FIG. 5 shows the relationship of the magnetization and the external magnetic field strength (10K) for the lanthanum strontium manganese oxide (LSMO) according to the present invention.

Hysteresis curve at 10K of the lanthanum strontium manganese oxide (LSMO) according to the present invention is measured. The result is shown in FIG. 5. When the external magnetic field strength is around 4000 Oe~5000 Oe, the negative resist reaches saturated magnetic susceptibility.

Example 6

Figure 6:
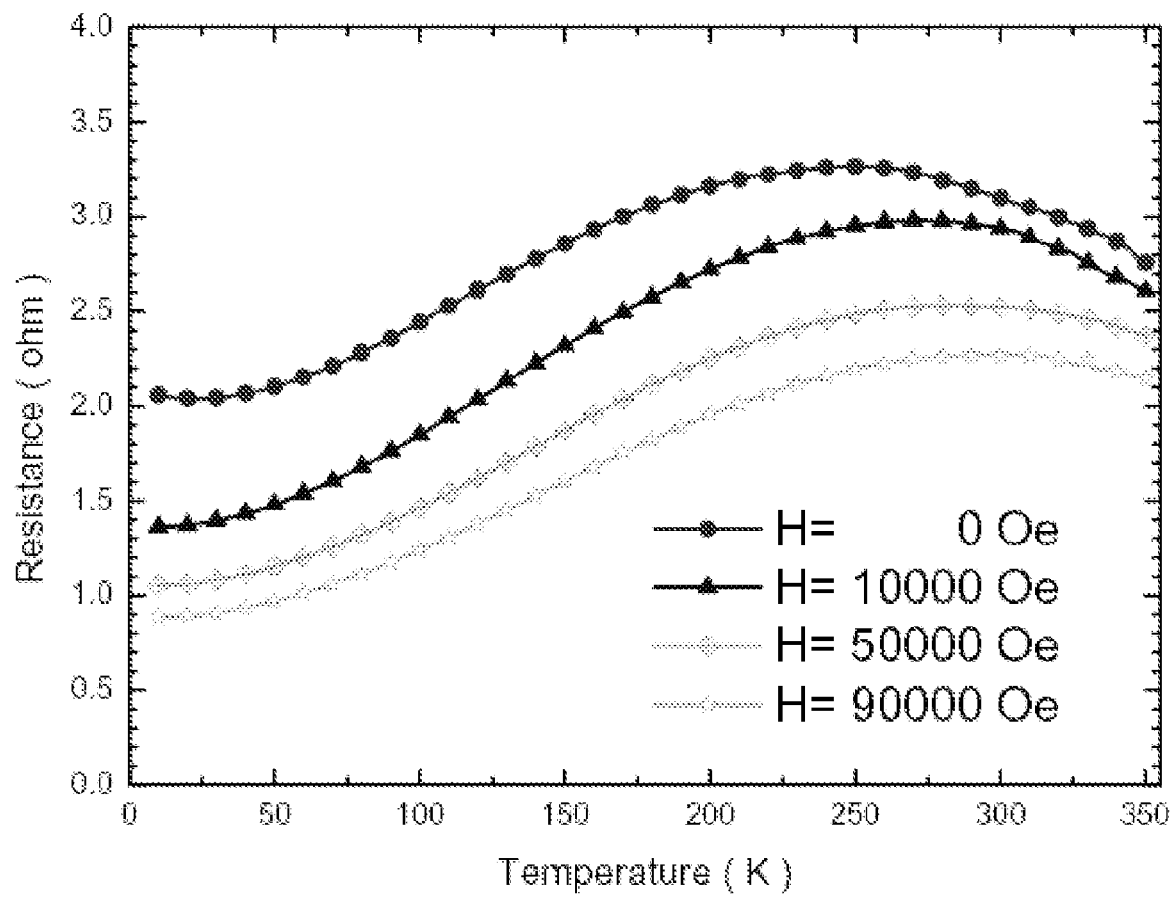
FIG. 6 shows the relationship of the temperature and the resistance for the lanthanum strontium manganese oxide (LSMO) according to the present invention under different external magnetic field strengths; and, FIG. 7 shows the relationship of the negative MR ratio and the temperature for the lanthanum strontium manganese oxide (LSMO) according to the present invention under different external magnetic field strengths.

The relationship of the temperature and the resistance for the lanthanum strontium manganese oxide (LSMO) according to the present invention under different external magnetic field strengths is measured in order to realize the influence of the external magnetic field on the resistance. The external magnetic field strengths of 10000 Oe, 50000 Oe, and 90000 Oe are selected to observe the changes in the resistance under different external magnetic field strengths, as shown in FIG. 6. The whole resistance of the negative resist gradually increases as the external magnetic field strength increases. Therefore, the influence of the external magnetic field on the negative resist provided by the present invention shows negative magnetoresist (MR) effect.

Example 7

Figure 7:
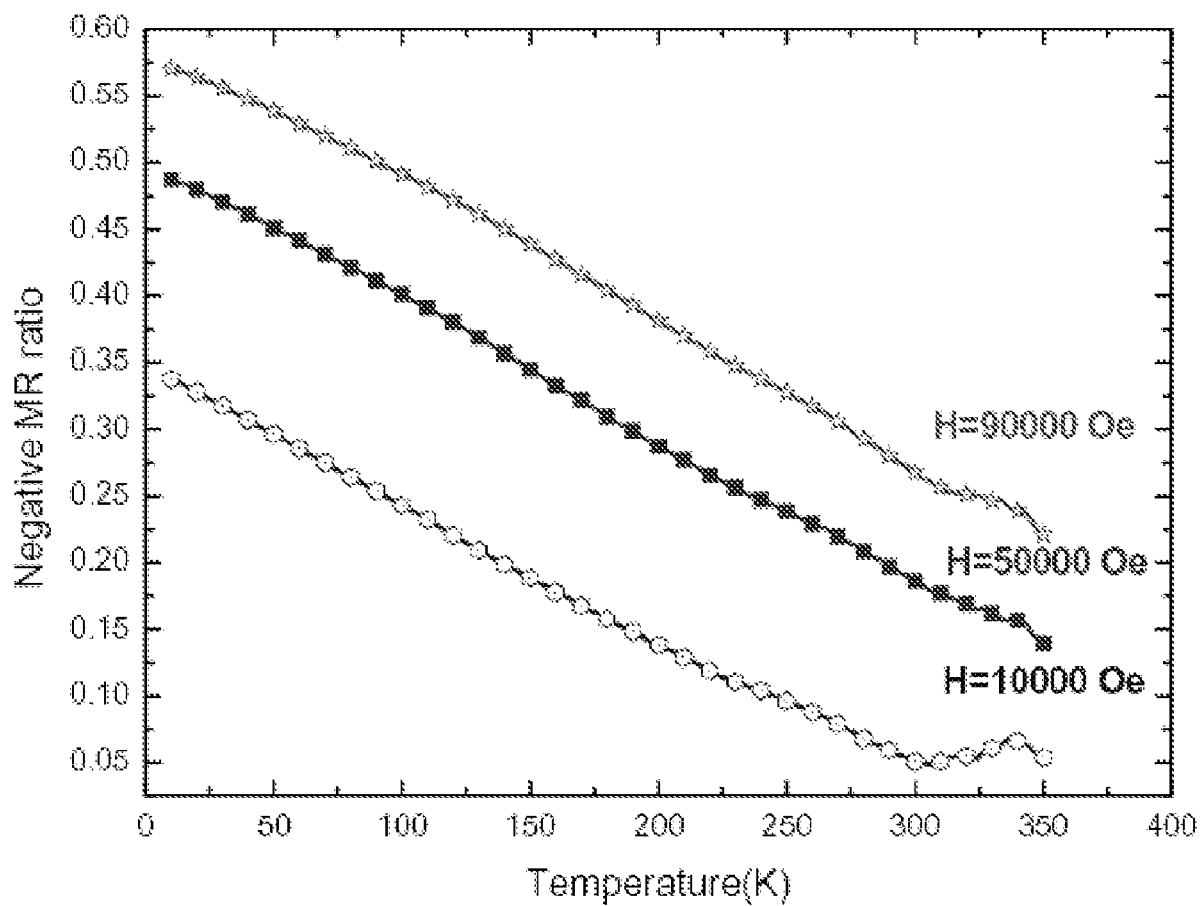

FIG. 7 is obtained by the calculation from the result of FIG. 6 and shows the relationship of the negative MR ratio and the temperature under different external magnetic field strengths. The greater the external magnetic field strength is, the larger the variation of the negative MR ratio of the negative resist provided by the present invention. The variation of the MR increases as the temperature decreases. The highest MR is at 10K (H=10000 Oe, MR %=38%).

Example 8

Process for Preparing Positive and Negative Dual Function Magnetic Resist

At first, three major compositions are prepared: (1) lanthanum strontium manganese magnetic precursor solution; (2) phase promoter solution; (3) resist solvent.

(1) Lanthanum Strontium Manganese Magnetic Precursor Solution

The lanthanum precursor, the strontium precursor, and the manganese precursor are mixed with the molar ratio of 7:3:10, respectively. The mixture is then mixed with solvent, such as pure water and stirred until becoming uniform to prepare a 5 wt % solution. In this example, the lanthanum precursor, the strontium precursor, and the manganese precursor comprise the following three categories:
(a) lanthanum nitrate, manganese nitrate, and strontium nitrate;
(b) lanthanum nitrate, manganese nitrate, and strontium hydroxide;
(c) lanthanum acetylacetonate, manganese acetylacetonate, and strontium acetylacetonate.

(2) Phase Promoter Solution

The phase promoter solution is of hydrophilic polymer to promote the precursors to form the perovskite crystal phase. The phase promoter comprises poly(acrylic acid), poly(vinyl alcohol) and so forth. The phase promoter is mixed with the solvent and then stirred to prepare a 10 wt % solution, that is, phase promoter solution.

(3) Resist Solvent

The resist solvent has to dissolve (1) lanthanum strontium manganese magnetic precursor solution and (2) phase promoter solution and is nontoxic to human beings.

Then, the three major compositions are mixed together with the volume ratio of 1:1:3. The mixed solution is stirred at the room temperature or the temperature below 80° C. until becoming clear transparent. After filtration, the positive and negative dual function magnetic resist with suspended particulates smaller than 100 μm is fabricated.

Example 9

Fabrication of Positive and Negative Dual Function Magnetic Resist Thin Film The positive and negative dual function magnetic resist from example 8 is spin-coated on a silicon wafer. The spin coating conditions are depended on the viscosity of the solution. After the spin-coated thin film is vacuumed at the room temperature for 12 hrs, a resist thin film is formed. Electron lithography or photolithography is used to form a positive or negative resist by varying the exposure dose. Finally, a water-soluble developer is used to perform a developing procedure so as to obtain the designed pattern.

The positive and negative dual function magnetic resist provided in this invention can also be applied in fabrication of photonic crystal slab. The fabricated LSMO photonic crystal slab was used to enhance photoluminescence of CdSe nanocrystals up to 280% due to its high refractive index characteristic (n=2.38).

To sum up, the present invention discloses a positive and negative dual function magnetic resist lithography method. At first, a substrate coated with a positive and negative dual function magnetic resist layer is provided. The positive and negative dual function magnetic resist layer comprises a manganese(Mn)-containing precursor and at least one hydrophilic polymer. Next, at least one exposure procedure for the positive and negative dual function magnetic resist layer is performed to form either a positive resist or a negative resist. In addition, after the at least one exposure procedure, a developing procedure using water-soluble developer is performed.

Obviously many modifications and variations are possible in light of the above teachings. It is therefore to be understood that within the scope of the appended claims the present invention can be practiced otherwise than as specifically described herein. Although specific embodiments have been illustrated and described herein, it is obvious to those skilled in the art that many modifications of the present invention may be made without departing from what is intended to be limited solely by the appended claims.

What is claimed is:

1. A positive and negative dual function magnetic resist lithography method, comprising:
   providing a substrate coated with a positive and negative dual function magnetic resist layer, wherein said positive and negative dual function magnetic resist layer comprises a manganese(Mn)-containing precursor and at least one hydrophilic polymer; and,
   performing at least one exposure procedure for said positive and negative dual function magnetic resist layer, so as to form either a positive resist or a negative resist.

2. The method according to claim 1, wherein said precursor comprises one selected from the group consisting of the following: nitrate, hydroxide, oxalate, metallic alcoholate, acetate, citrate, and acetylacetone complex.

3. The method according to claim 1, wherein said hydrophilic polymer comprises one selected from the group consisting of the following: poly(acrylic acid) and poly(vinyl alcohol).

4. The method according to claim 1, wherein said positive and negative dual function magnetic resist layer further comprises an organic acid.

5. The method according to claim 4, wherein said organic acid comprises citric acid.

6. The method according to claim 1, wherein the molar ratio of said manganese to said at least one hydrophilic polymer is about from 0.05 to 20.

7. The method according to claim 1, wherein the molar ratio of said manganese to said at least one hydrophilic polymer is about from 0.5 to 5.

8. The method according to claim 1, wherein said positive and negative dual function magnetic resist layer further comprises a water-soluble solvent.

9. The method according to claim 8, wherein said water-soluble solvent comprises one selected from the group consisting of the following: pure water, alcohol, and ketone.

10. The method according to claim 1, wherein part of said precursor and/or part of said at least one hydrophilic polymer are suspended particulates in said positive and negative dual function magnetic resist layer.

11. The method according to claim 10, wherein said suspended particulates have diameters smaller than or equal to 100 μm.

12. The method according to claim 1, wherein said exposure procedure uses electron beams.

13. The method according to claim 12, wherein said positive and negative dual function magnetic resist layer forms a positive resist in the case of the exposure dose being within a first range while said positive and negative dual function magnetic resist layer forms a negative resist in the case of the exposure dose being within a second range in which the exposure dose in said second range is greater than that in said first range.

14. The method according to claim 13, wherein said first range is about from 0.5 mC/cm$^2$ to 5 mC/cm$^2$.

15. The method according to claim 13, wherein said second range is about from 5 mC/cm$^2$ to 40 mC/cm$^2$.

16. The method according to claim 1, wherein said exposure procedure further comprises a heating procedure in which said positive and negative dual function magnetic resist layer is heated within a first temperature range and thereby forms a positive resist while said positive and negative dual function magnetic resist layer is heated within a second temperature range and thereby forms a negative resist, and besides the temperature in said second temperature range is greater than that in said first temperature range.

17. The method according to claim 16, wherein said first temperature range is about from 50° C. to 180° C.

18. The method according to claim 16, wherein said second temperature range is about from 180° C. to 400° C.

19. The method according to claim 1, after completion of said exposure procedure, further comprising a developing procedure that uses a water-soluble developer.

20. A positive and negative dual function magnetic resist lithography method, comprising:
providing a substrate coated with a positive and negative dual function magnetic resist layer, wherein said positive and negative dual function magnetic resist layer comprises at least one hydrophilic polymer, a manganese(Mn)-containing first precursor, and at least one second precursor in which said second precursor each comprises one metallic element selected from the group consisting of the following: La, Sr, Ca, Ba, and Pb; and,
performing at least one exposure procedure for said positive and negative dual function magnetic resist layer, so as to form either a positive resist or a negative resist.

21. The method according to claim 20, wherein the molar ratio of said manganese in said first precursor to total of said metallic elements in said at least one second precursor is 1:1.

22. The method according to claim 20, wherein the molar ratio of said metallic elements to said at least one hydrophilic polymer is about from 0.05 to 20.

23. The method according to claim 20, wherein the molar ratio of said metallic elements to said at least one hydrophilic polymer is about from 0.5 to 5.

24. The method according to claim 20, wherein said exposure procedure uses electron beams.

25. The method according to claim 24, wherein said positive and negative dual function magnetic resist layer forms a positive resist in the case of the exposure dose being within a first range while said positive and negative dual function magnetic resist layer forms a negative resist in the case of the exposure dose being within a second range in which the exposure dose in said second range is greater than that in said first range.

26. The method according to claim 25, wherein said first range is about from 0.5 mC/cm$^2$ to 5 mC/cm$^2$.

27. The method according to claim 25, wherein said second range is about from 5 mC/cm$^2$ to 40 mC/cm$^2$.

28. The method according to claim 20, wherein said exposure procedure further comprises a heating procedure in which said positive and negative dual function magnetic resist layer is heated within a first temperature range and thereby forms a positive resist while said positive and negative dual function magnetic resist layer is heated within a second temperature range and thereby forms a negative resist, and besides the temperature in said second temperature range is greater than that in said first temperature range.

29. The method according to claim 28, wherein said first temperature range is about from 50° C. to 180° C.

30. The method according to claim 28, wherein said second temperature range is about from 180° C. to 400° C.

31. The method according to claim 20, further comprises: a developing procedure that uses a water-soluble developer, after said at least one exposure procedure.

32. A positive and negative dual function magnetic resist lithography method, comprising:
providing a substrate coated with a positive and negative dual function magnetic resist layer, wherein said positive and negative dual function magnetic resist layer comprises at least one hydrophilic polymer, a lanthanum precursor, a strontium precursor, and a manganese precursor in which the molar ratio of the sum of said lanthanum and strontium to said manganese is 1:1; and,
performing at least one exposure procedure for said positive and negative dual function magnetic resist layer, so as to form either a positive resist or a negative resist.

33. The method according to claim 32, wherein the molar ratio of said lanthanum to said strontium is 7:3.

34. The method according to claim 32, wherein the molar ratio of said metallic elements to said at least one hydrophilic polymer is about from 0.05 to 20.

35. The method according to claim 32, wherein the molar ratio of said metallic elements to said at least one hydrophilic polymer is about from 0.5 to 5.

36. The method according to claim 32, wherein said exposure procedure uses electron beams.

37. The method according to claim 36, wherein said positive and negative dual function magnetic resist layer forms a positive resist in the case of the exposure dose being within a first range while said positive and negative dual function magnetic resist layer forms a negative resist in the case of the exposure dose being within a second range in which the exposure dose in said second range is greater than that in said first range.

38. The method according to claim 37, wherein said first range is about from 0.5 mC/cm$^2$ to 5 mC/cm$^2$.

39. The method according to claim 37, wherein said second range is about from 5 mC/cm$^2$ to 40 mC/cm$^2$.

40. The method according to claim 32, wherein said exposure procedure further comprises a heating procedure in which said positive and negative dual function magnetic resist layer is heated within a first temperature range and thereby forms a positive resist while said positive and negative dual function magnetic resist layer is heated within a second temperature range and thereby forms a negative resist, and besides the temperature in said second temperature range is greater than that in said first temperature range.

41. The method according to claim 40, wherein said first temperature range is about from 50° C. to 180° C.

42. The method according to claim 40, wherein said second temperature range is about from 180° C. to 400° C.

43. The method according to claim 32, further comprises: a developing procedure that uses a water-soluble developer, after said at least one exposure procedure.

* * * * *